United States Patent [19]

Buckley

[11] 4,329,410

[45] May 11, 1982

[54] PRODUCTION OF X-RAY LITHOGRAPH MASKS

[75] Inventor: W. Derek Buckley, Easton, Conn.

[73] Assignee: The Perkin-Elmer Corporation, Norwalk, Conn.

[21] Appl. No.: 107,749

[22] Filed: Dec. 26, 1979

[51] Int. Cl.³ .................... G03C 5/16; B05D 3/06; G21K 3/00; H05G 1/00
[52] U.S. Cl. ........................... 430/5; 430/16; 430/17; 430/296; 430/328; 430/396; 430/966; 430/967; 430/156; 427/160
[58] Field of Search ............... 430/966, 967, 296, 328, 430/156, 396, 5, 16, 17; 427/160

[56] References Cited

U.S. PATENT DOCUMENTS

| | | | |
|---|---|---|---|
| 2,702,243 | 2/1955 | Schmidt | 430/156 |
| 3,313,626 | 4/1967 | Whitney | 430/394 |
| 3,317,320 | 5/1967 | Reber | 430/394 |
| 3,423,205 | 1/1969 | Skaggs et al. | 430/394 |
| 3,743,842 | 7/1973 | Smith et al. | 430/967 |
| 3,971,860 | 7/1976 | Bruers et al. | 430/5 |
| 4,018,938 | 4/1977 | Feder et al. | 430/967 |
| 4,022,927 | 5/1977 | Pfeiffer et al. | 430/966 |
| 4,035,522 | 7/1977 | Hatzakis | 430/966 |
| 4,123,272 | 10/1978 | Quinn | 430/328 |
| 4,211,834 | 7/1980 | Lapadula et al. | 430/5 |
| 4,260,670 | 4/1981 | Burns | 430/5 |

OTHER PUBLICATIONS

Moron, J. M. et al., "High Resolution Steep Profile, Resist Patterns," *The Bell System Tech. Journal*, vol. 58, No. 5, 5/1979, pp. 1027–1036.
Moran, J. M. et al., "Photopolymer Principles—Processes and Materials," 10/1979, Soc. of Plastics Eng. Inc., pp. 248–255 and FIG. 1–11.
Dunkleberger, L. N., "Stencil Technique . . . Josephson Devcies," *J. Vac. Sci. Tech.*, 15 (1), 1/1978.
Spiller, E. et al., "X–Ray Lithography for Bubble Devices," *Solid State Technology*, 4/1976, pp. 62–67.
Romankiw et al., *IBM Tech. Disclosure Bulletin*, vol. 18, No. 12, 5/1976, p. 4219.
Dolgov et al., *IBM Tech. Disclosure Bulletin*, vol. 15, No. 8, 1/1973, p. 2570.
Howe, D., *Research Disclosure*, 9/1978, #17358.
Flanders, D. C., *J. Vac. Sci. Tech.*, pp. 1615–1619, 16(c), 12/1979.
MacIntyre et al., *IBM Technical Disclosure Bulletin*, vol. 14, No. 10, 3/1972, p. 2878.

*Primary Examiner*—Charles L. Bowers, Jr.
*Attorney, Agent, or Firm*—S. A. Giarratana; E. T. Grimes; T. P. Murphy

[57] ABSTRACT

A method of depositing X-ray absorber patterns on a mask membrane to achieve minimum pattern feature dimensions less than 1 μm. The membrane is covered with an ultraviolet (VU) sensitive photoresist which carries a thin metallic film. The metallic film is coated with an electron beam resist. The electron beam resist is exposed to the desired pattern by an electron beam. After development, the metal film is etched through the remaining electron beam resist. This forms a stencil overlying the lower UV photoresist layer which is then exposed by an ultraviolet or soft X-ray source. After development, an X-ray absorber, such as gold, is deposited on the membrane. The final exposure step may be done by means of a point source of radiation. The X-ray absorbers will then have sloping walls to prevent shadowing of the X-ray source.

11 Claims, 4 Drawing Figures

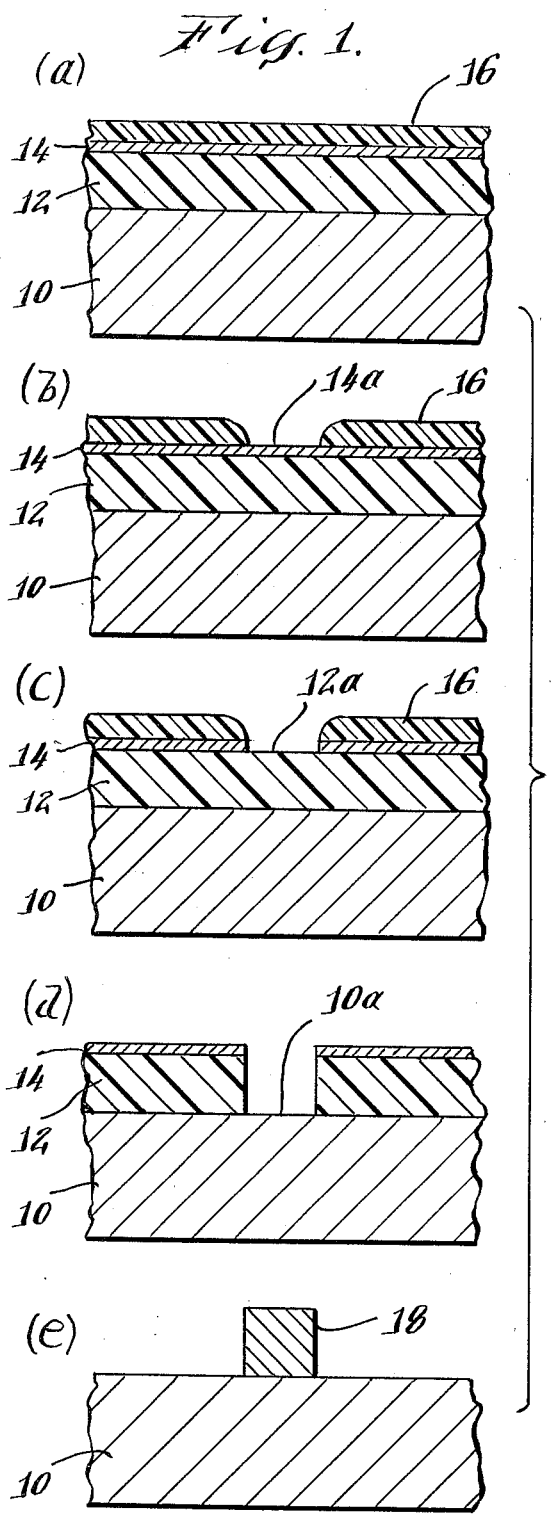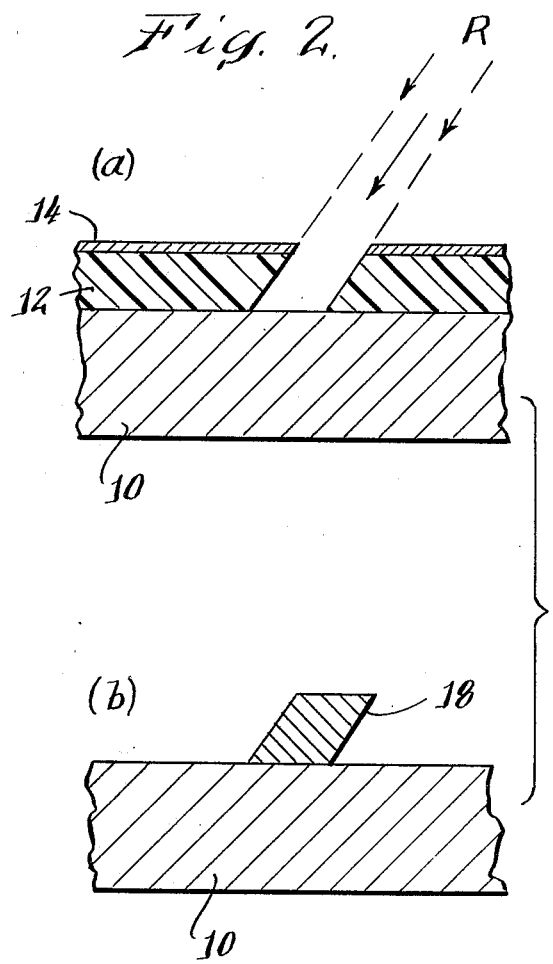

PRODUCTION OF X-RAY LITHOGRAPH MASKS

BACKGROUND OF THE INVENTION

The microelectronics industry is turning to X-ray lithography (XRL), in order to produce patterns on wafers having minimum feature sizes below the capabilities of optical techniques. It is desired, for example, to reproduce accurately features less than 1 μm. The present invention relates to a process for producing X-ray lithographic masks having such sub-micron features.

It is desired to deposit on a mask membrane an X-ray absorber pattern having a minimum pattern dimension of approximately 0.5 μm. Furthermore the thickness of the absorber, which may be gold, for example, must abe sufficient to produce at least a 5 to 1 X-ray contrast. This is the ratio of transmission through the bare membrane to transmission through the absorber. When the absorber is gold, this means that the minimum absorber thickness must be approximately 5,000 Å.

The only available technique for generating submicron features with the potential for generating features as small as 0.25 μm is electron-beam lithography. To achieve practical exposure times over large areas, it is necessary to use a sensitive resist such as poly (butene-1 sulfone) (PBS). However, electron scattering limits the thickness of such a resist to approximately 2000–3000 Å. It would be desirable to transfer the capability of electron beam lithography to produce fine lines in thin resist layers to thicker resist layers.

As 5,000 Å equals 0.5 μm, it will be appreciated that another problem in producing such masks is that they require patterns having width to thickness aspect ratios of approximately 1:1. For various technical reasons known to those skilled in the art, prior art undercut etching techniques for depositing gold in such dimensions by evaporation and liftoff, are not satisfactory.

Another problem presented by such high aspect ratios of the absorber pattern arises from the fact that the mask pattern is exposed on the wafer by means of an X-ray point source. Those portions of the mask which are not in axial alignment with the X-ray point source create undesirable shadowing which it would be preferable to eliminate.

Accordingly, the primary object of the present invention is to provide an improved technique for manufacturing an X-ray lithographic mask having minimum feature sizes less than 1 μm. Another object is to provide such a technique wherein the absorber pattern on the mask results in minimum undesired shading of the X-ray source. Other objects, features, and advantages will become apparent from the following description and appended claims.

SUMMARY OF THE INVENTION

The method of fabricating a mask for use in X-ray lithography wherein a layer of photoresist is applied to a mask membrane; a thin film of metal is applied to the photoresist; and a film of electron beam photoresist is applied to the metal film. The electron beam photoresist is then exposed by an electron beam to form a selected exposure pattern therein. The electron beam photoresist is then developed to remove the exposure pattern and selectively reveal the metal film, which is then etched to replicate the exposure pattern therein. Residual electron beam photoresist is then removed and the base photoresist layer is exposed through the replicated pattern from a radiation source. The base photoresist is then developed to selectively reveal the membrane and desired X-radiation absorbing material is deposited on the membrane portion so revealed.

BRIEF DESCRIPTION OF THE DRAWINGS

FIGS. 1(a)–(e) are greatly enlarged cross-sections through a mask membrane illustrating the sequence of steps in the method of the invention;

FIGS. 2(a) and (b) illustrate the manner by which the method of the invention produces non-shadowing mask patterns;

DESCRIPTION OF THE PREFERRED EMBODIMENT

Figure 3:
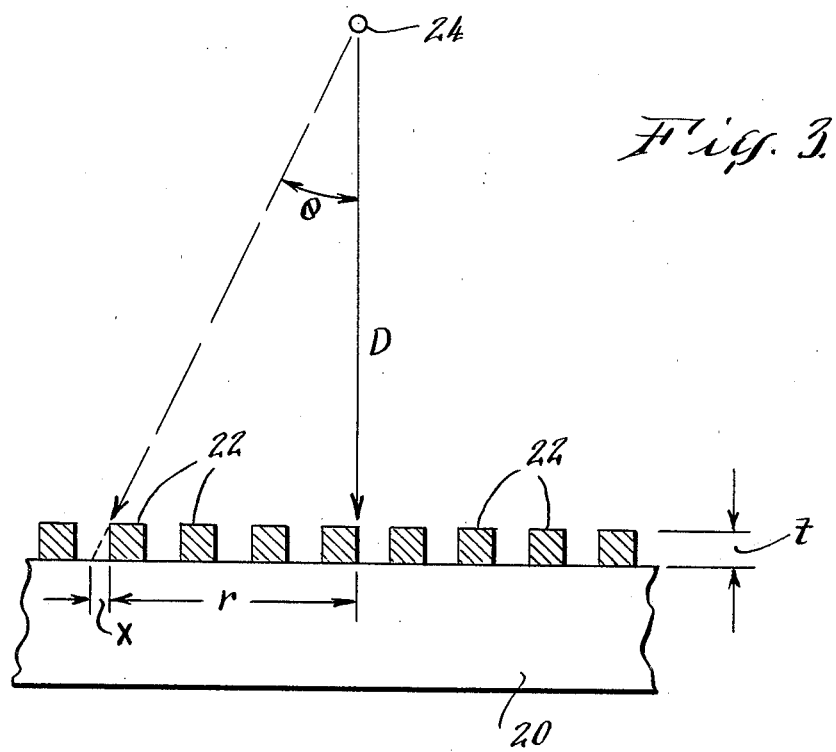
FIG. 3 schematically illustrates the X-ray shadowing problem presented by high aspect ratio mask pattern features.

In FIG. 1(a), there is illustrated a portion of a mask membrane 10. As it is intended for use in X-ray lithography, it need not be optically transparent, but may be a metal such as titanium. Alternatively, it may be a film of a plastic such as a film of polyimide. The thickness of the membrane will depend upon its material, as well as other factors. It may range from 0.75 μm for titanium to 15 μm for polyimide, for example. Its diameter may be approximately 3 inches. Applied to the surface of the membrane 10, is a layer 12 of a conventional ultraviolet photoresist or a photoresist sensitive to deep ultraviolet (wavelengths less than 3,000 Å) such as polymethyl methacrylate (PMMA). The PMMA has a longer exposure time than conventional photoresist. However, it has the advangage of achieving high aspect ratio features upon exposure and development. A suitable PMMA photoresist was prepared from powder supplied by Esschem, Inc. with a molecular weight of 950,000. It was dissolved in trichloroethylene to a concentration of 3.74 weight % PMMA. The photo resist layer 12 is applied in a conventional manner, as by spinning and may have a thickness of approximately 0.5–3 μm. The exposed surface of the photoresist layer 12 is coated with a thin layer 14 of an ultraviolet opaque material. Examples of such materials include metals such as aluminum, chromium or silver which may be applied by evaporation or sputtering to a thickness of approximately 0.1 μm. Also AZ 1350 photoresist may be used as the ultraviolet opaque material over PMMA. AZ-1350 available from Shipley is a m—cresol formaldehyde in a sensitizer naphtho-quinone-(1, 2)-diazide sulfonic acid ester. Finally, there is applied a layer 16 of an electron beam photoresist. One suitable electron beam photoresist is PBS which has a resolution of 0.5 μm. The thickness of layer 16 may be approximately 0.3 μm. Other useful electron beam resists are PMMA, GMC and AZ 1350. If features smaller than 0.5 μm are required, a higher resolution electron beam resist, such as PMMA may be used instead of PBS.

To form the mask, the desired pattern is exposed on the surface of the electron beam photoresist layer 16 by means of electron beam lithography in the established manner. Upon development of the electron beam photoresist, exposed areas are removed, as illustrated in FIG. 1(b), to reveal portions 14a of the metallic layer 14. The exposed metal is removed by etching in a conventional manner either wet or dry to reveal portions 12a of the photoresist layer 12. The residue of the electron beam photoresist layer 16 is then removed.

It will now be seen that the result of the steps taken thus far in the process has been to form, in effect, a thin stencil 14 which rests directly on the underlying photoresist layer 12. Using the etched pattern in the metallic stencil layer 14 as a mask, the photoresist layer 12 is exposed to deep ultraviolet radiation from a point source, such as a mercury lamp having a fused quartz envelope. One suitable source is a 200 watt dc lamp having an effective arc size of 0.5 by 1.5 mm at a distance of approximately 7.5 cm from the stencil. Subsequent development results in portions 10a of the membrane 10 being uncovered. The same result can be produced by substituting a point X-ray source for the mercury lamp. In this case, layer 12 must be an X-ray photoresist e.g. PMMA. In addition a long wavelength X-ray source such as carbon $k$(44 Å) is preferred so that good contrast can be obtained using a thin layer 14. Thereafter, an X-ray absorber, such as gold, is applied as by electroplating or electroless deposition. (Other suitable absorbers might include erbium, copper hafnium, tungsten tantalum and platinum.) Upon removal of the remaining photoresist there is left behind an X-ray absorber 18 in the desired pattern.

As illustrated in FIG. 1, the walls of the absorber 18 appear to be vertical. This results from the fact that the ultraviolet point source was essentially aligned with the illustrated pattern feature. However, an important feature derived from the practice of this invention is that the walls of the absorber are not truly vertical but are inclined toward the point source.

This is illustrated in FIGS. 2(a) and 2(b) which illustrate the method of the invention as it relates to a region displaced from the center of the membrane 10. As will be seen from FIG. 2(a), the ultraviolet radiation R from the ultraviolet point source passes through the stencil 14 and exposes the photoresist 12 in a non-vertical configuration. This configuration is then replicated in the X-ray absorber 18 as illustrated in FIG. 2(b). This is a very important feature in the production of masks which are to be used for X-ray lithography inasmuch as X-rays also emanate from a point source. The reason for this is illustrated in FIGS. 3 and 4.

Figure 4:
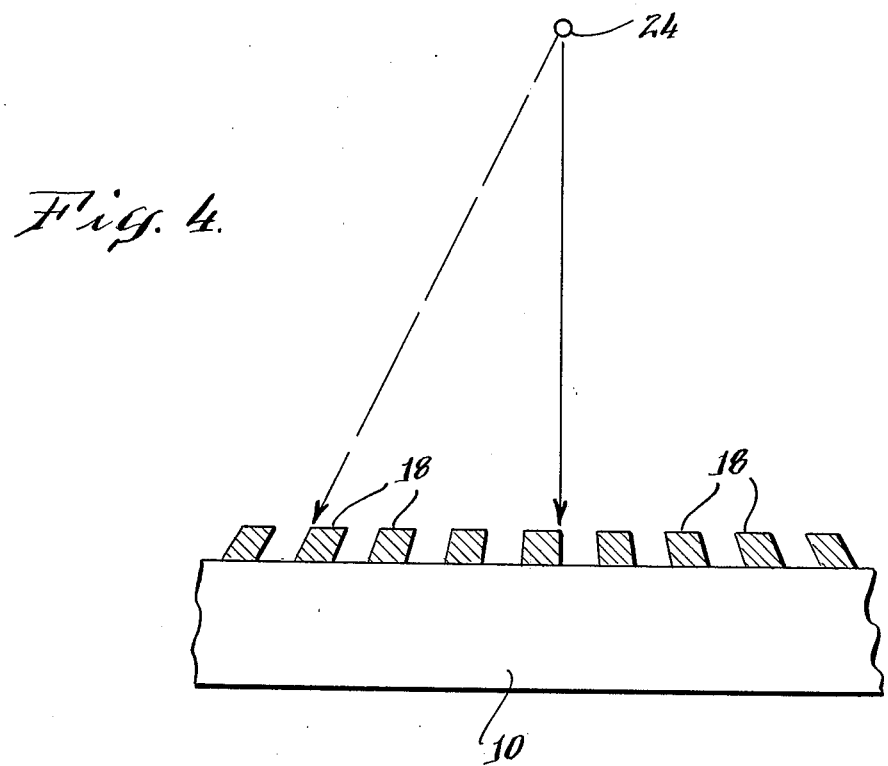
FIG. 4 is an illustration similar to FIG. 3 illustrating the manner in which the problem of X-ray shadowing is overcome.

FIG. 3 illustrates a conventional mask membrane 20 having thereon a pattern of X-ray absorbers 22 with vertical sidewalls being irradiated from a point source 24. As will be apparent from the illustration, the maximum amount of shadowing x depends upon the mask radius r, the absorber thickness t, and the source to mask distance D. In one typical X-ray lithograpny system, D is 15 cm, and r is approximately 3.5 cm. When the thickness t of the absorber is 5,000 Å, the minimum for gold, the maximum shadow length x is approximately 1,250 Å or $\frac{1}{8}$ μm. For a line width of 0.5 μm, which the present invention envisages, this represents $\frac{1}{4}$ of the line width. The problem is eliminated if the absorbers have sidewalls which lean in the direction of the point source. This is illustrated in FIG. 4 wherein the mask has been made in accordance with the present invention, employing an ultraviolet point source in the manufacture, so that the absorbers 18 have inclined walls. When the X-ray source 24 is then placed at the same distance from the mask as the ultraviolet source, shadowing is substantially eliminated. It should be noted that the actual distance D which causes a given angular divergence could be different if intermediate optics were interposed between the point source and the completed mask.

As pointed out above, one method of depositing the X-ray absorber is by electroplating. When the mask membrane 10 is metallic, this presents no problem. However, if the membrane is non-metallic and therefore non-conductive, it may be necessary to apply a very thin conductive layer before applying the photoresist layer 12. This may be, for example, an evaporated chromium or gold base of approximately 200 Å thickness.

It is believed that the many advantages of this invention will now be apparent to those skilled in the art. It will also be apparent that a number of variations and modifications may be made therein without departing from its spirit and scope. Accordingly, the foregoing description is to be construed as illustrative only, rather than limiting. This invention is limited only by the scope of the following claims.

What is claimed is:

1. The method of fabricating a mask for use in X-Ray lithography which comprises:

providing a mask membrane of a material substantially transparent to X-radiation;

applying a layer of UV photoresist to said membrane;

applying a thin film of UV-opaque material to said photoresist;

applying a film of electron beam photoresist to said UV-opaque film;

exposing said film of electron beam photoresist to an electron beam to form a selected exposure pattern therein;

developing said electron beam photoresist to remove said exposure pattern and selectively reveal said UV-opaque film;

removing said UV-opaque film where revealed to replicate said exposure pattern therein;

exposing said UV photoresist through said replicated pattern from a point source of radiation at a distance from said membrane substantially equal to the desired distance of the completed mask from an X-Ray source;

developing said UV photoresist where exposed to selectively reveal said membrane in said exposure pattern wherein the UV photoresist remaining after developing defines sloping sidewalls substantially aligned with said radiation point source;

and deposition an X-Radiation absorbing material on the revealed portions of said membrane.

2. The method of claim 1 wherein said UV-opaque material is a metal.

3. The method of claim 2 wherein said metal is removed by etching.

4. The method of claim 2 wherein said metal is chromium.

5. The method of claim 2 wherein said metal is aluminum.

6. The method of claim 2 wherein said metal is silver.

7. The method of claim 2 wherein said UV-opaque material is AZ 1350 photoresist.

8. The method of claim 1 wherein said UV photoresist layer has a thickness in the approximate range of 0.5–3 μm.

9. The method of claim 1 wherein said UV photoresist is polymethyl methacrylate.

10. The method of claim 1 wherein said electron beam photoresist is poly (butene-1 sulfone).

11. The method of claim 1 wherein said deposited X-radiation absorbing material defines sidewalls adjacent the sloping sidewalls of said UV photoresist.

* * * * *